United States Patent [19]
Tarutani et al.

[11] Patent Number: 4,563,695
[45] Date of Patent: Jan. 7, 1986

[54] SUPERCONDUCTING SWITCHING DEVICE

[75] Inventors: Yoshinobu Tarutani, Kitatsuru; Toshikazu Nishino, Kawasaki, both of Japan

[73] Assignee: Hitachi, Ltd., Tokyo, Japan

[21] Appl. No.: 575,273

[22] Filed: Jan. 30, 1984

[30] Foreign Application Priority Data

Jan. 28, 1983 [JP] Japan .................. 58-11541

[51] Int. Cl.[4] .......................................... H01L 39/22
[52] U.S. Cl. ........................................ 357/5; 357/4; 307/306
[58] Field of Search ................ 357/4, 5; 307/306

[56] References Cited

U.S. PATENT DOCUMENTS 3,803,459  4/1974  Matisoo ..................... 307/306 X
4,224,630  9/1980  Kroger ............................ 357/5
4,432,134  2/1984  Jones et al. ...................... 357/5
4,486,464 12/1984  Young ............................. 357/5

OTHER PUBLICATIONS

Harris, I.B.M. Tech. Discl. Bull., vol. 20, No. 6, Nov. 1977.
Grebe IBM Tech. Discl. Bull., vol. 13, No. 11, Apr. 1971.

Primary Examiner—Martin H. Edlow
Attorney, Agent, or Firm—Antonelli, Terry & Wands

[57] ABSTRACT

A superconducting switching device is provided in which a base electrode layer of a sandwich type superconducting tunnel junction and a control line film are formed at the same level. The control line film having a high accuracy pattern can be formed, and the number of overall layers can also be reduced.

7 Claims, 5 Drawing Figures

SUPERCONDUCTING SWITCHING DEVICE

BACKGROUND OF THE INVENTION

This invention relates generally to a superconducting switching device using a superconducting tunnel junction (Josephson junction). More particularly, the present invention relates to the structure of the superconductiong switching device which reduces the number of layers of the device as a whole and is particularly suitable for miniaturization and for improvement of the reliability of the production process.

The structure disclosed by the article of Gheewala ("Design of 2.5-Micrometer Josephson Current Injection Logic (CIL)", T. R. Gheewala, IBM, J. Res. Develop. Vol. 24, No. 2, p130 (1980) ) has been widely used in the past as the structure for superconducting switching devices. The sectional structure of these devices is illustrated in FIG. 1. In the devices having such a structure, a control line 9 for controlling a superconducting quantum interference device (SQUID) is disposed at the upper part of a superconducting interferometer via an insulating film 8 consisting of Sio, for example. In the device, the control line film must have the smallest line width possible. Since the control line film is disposed at the upper part of the junction, however, it must pass through the step portion where the difference of the height is the greatest. This means that there is a high probability that breakage of the control line film will develop at the step portion. To avoid this problem, the control line film must be thick. Unfortunately, if the film thickness is increased the minimum value of the line width that can be realized becomes undesirably large.

In the conventional device structure, the control line film is disposed on the tunnel junction via an inter-layer insulating film so that there is a large number of films in the direction of thickness of the substrate. Hence, it is highly probable that defects will occur in the pattern, interconnection and device characteristics.

Incidentally, in FIG. 1, reference numeral 1 is a single crystal silicon wafer; 2 is a magnetic shielding film; 3 is an anodic oxidation film; 4 is an inter-layer insulating film consisting of SiO; 5 is a base electrode of a tunnel junction; 6 is an inter-layer insulating film consisting of SiO; 7 is a counter electrode; 10 is a tunnel junction barrier layer; 11 is a thermal oxidation silicon layer; and 12 is a resistance film.

The following reference are cited to show the state of the art.

(1) U.S. Pat. No. 3,803,459
(2) Japanese Patent Laid-Open No. 118392/1974
(3) T. R. Gheewala; IBM J. Res. Develop., Vol. 24, No. 2 (March 1980), page 130

SUMMARY OF THE INVENTION

It is an object of the present invention to provide a superconducting switching device in which a control line film, which has the smallest line width among the lines of the superconducting switching device, is formed without causing defects such as breakage. It is also an object to accomplish this while reducing the number of overall layers.

The superconducting switching device of the present invention to accomplish the objects described above has:

(1) structure in which the control line film is formed as a layer having the same level as a base electrode of a sandwich type superconducting tunnel junction.

More preferably, the superconducting switching device of the invention has:

(2) a structure in which both of the control line film and the base electrode of the tunnel junction are formed on a flat substrate devoid of any step;
(3) a structure in which both of the control line film and the base electrode of the tunnel junction are formed as the base on a substrate crystal (preferably, a single crystal) itself on which other superconducting film, insulating film and the like are not formed; and/or
(4) a structure in which both of the control line film and the base electrode of the superconducting tunnel junction consists of Nb or a superconductor containing Nb as its component.

Needless to say, all of the requirements (1) through (4) are most preferably satisfied.

DESCRIPTION OF THE PREFERRED EMBODIMENTS

It is obvious that if the control line film has the same level as the level of the counter electrode film or base electrode film of a tunnel junction device, one superconducting film and one inter-layer insulating film can be omitted, that is, a total of two layers. If the level of the control line film is the same as the level of the counter electrode film of the tunnel junction, however, a step develops on the control line film at the edge of the base electrode film of the tunnel junction. If the level of the control line film is the same as the level of the base electrode film of the tunnel junction, as in the present invention, the problem of a step occurring due to the tunnel junction device itself does not, in fact, occur.

Figure 1:
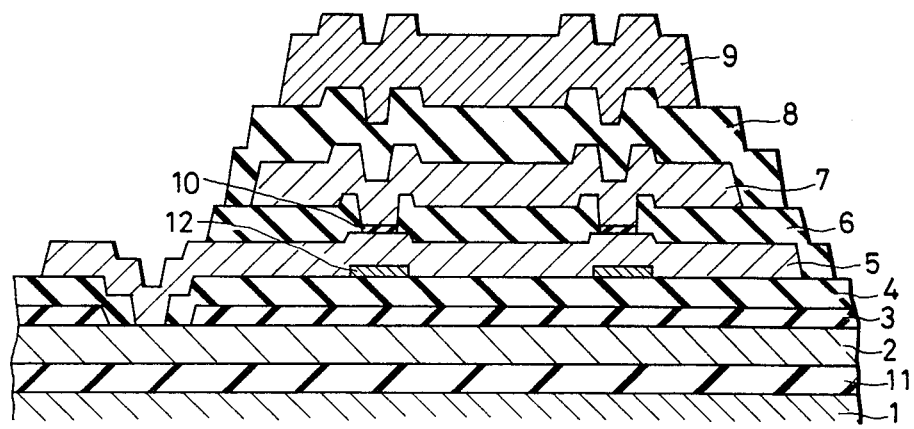
FIG. 1 is a sectional view of a superconducting switching device having a conventional structure.
Figure 2:
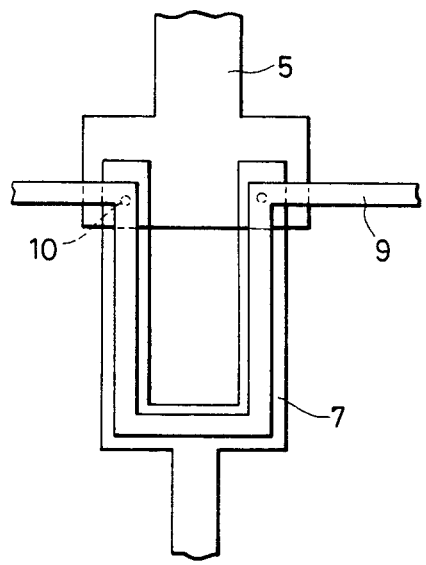
FIG. 2 is a top view of a two junction quantum interferometer having a conventional structure.

If the control line film and the base electrode film of the tunnel junction are the layers having the same level as in the present invention, the problem occurs whether or not the control line film effectively generates a magnetic field and whether or not the Josephson junction or a quantum interferometer can be switched. FIG. 2 illustrates the case of a two junction quantum interferometer. This interferometer has a conventional structure in which a tunnel junction barrier layer 10 is formed on a square base electrode film 5 of the tunnel junction. A ⊐ -shaped counter electrode 7 is formed on the former. The shapes of the counter electrode film 7 and base electrode film 5 may be reversed. Furthermore, a control line film 9 is disposed via an interlayer insulating film, as depicted in FIG. 2. The quantum interferometer is controlled in the following manner. A magnetic field is generated when a current is caused to flow through the control line film 9, and the quantum interferometer senses this field through mutual inductance between the control line and the interferometer loop. The amount of magnetic flux to be applied to the quantum interferometer is one flux quantum, as is well known in the art.

Figure 3:
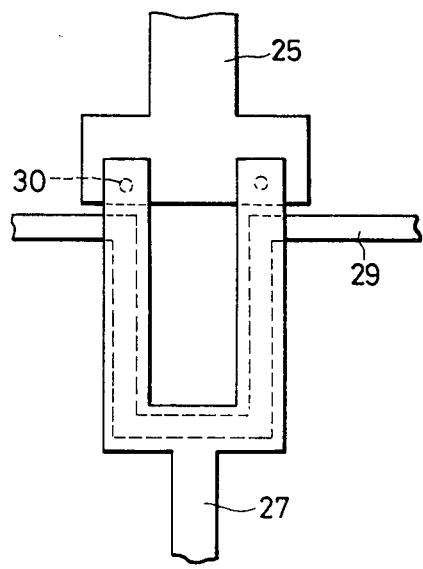
FIG. 3 is a top view of the two junction quantum interferometer in accordance with one embodiment of the present invention.

The structure of the quantum interferometer in the present invention is illustrated in FIG. 3. In the drawing, the control line film 29 is formed using the same mask and the same superconducting film layer as those of the base electrode film 25 of the tunnel junction. The counter electrode film 27 of the tunnel junction is formed on this control line film 29 via an inter-layer insulating film (lower insulating film). A magnetic flux is generated inside the quantum interferometer loop by causing a current to flow through the control line film in the same way as in the conventional quantum interferometer. In the present invention, the control line can not be extended to the position of the base electrode due to the structural limitation. In wiring the control line film in accordance with the conventional method, the direction of generation of the magnetic flux at the portion of the base electrode is the longitudinal direction of the square shape of the base electrode. Therefore, contribution of mutual inductance at this portion can be neglected. Accordingly, the gain of the generated signal to the control signal is never lower in the structure of the quantum interferometer of the present invention than in the conventional structure.

In conjunction with the device structure of the present invention, the item (2) described earlier is quite natural in order to eliminate the step of the control line film. Elimination of the step is realized by this structure in cooperation with the structure described in the item (1).

In conjunction with the item (3) of the device structure of the present invention, Nb or Nb type superconducting film is preferably formed on a clean crystal (including amorphous) surface in order to secure sufficient bonding power of the film. Although the substrate surface is preferably a single crystal, a polycrystalline or amorphous material can also be used. Examples of crystals (including amorphous materials) which can be used for the substrate are Si, $Al_2O_3$, MgO and the like, but the invention is not particularly limited to this.

In conjunction with the item (4) of the device structure of the present invention, Nb and superconducting materials containing Nb as their component, such as $Nb_3Sn$, $Nb_3Al$, $Nb_3Ga$, $Nb_3Ge$, $Nb_3Si$, NbN, NbC and the like, are extremely preferable because the critical temperature of Nb is 9° K. and these superconducting materials have sufficient superconductivity to be used at a liquid helium temperature. The grain size of Nb is about 500 Å while that of the Pb alloy film used for the conventional control line film is about 1 μm. In other words, Nb or the Nb type materials are materials that can withstand delicate work of up to 1 μm. Further advantageously, Nb or the Nb materials have a high melting point (2,500° C.) and high chemical stability so that even when other superconducting layer(s) and inter-layer insulating film layer(s) are laminated on the Nb film layer, it can sufficiently withstand the formation of these films or patterning.

The thickness of the control line film must be at least 8,000 Å in the conventional structure for the following reason. Since the control line film is disposed at the upper layer portion, a step is formed when it passes through the film edge portion of the lower layers, and the control line film can not be cut at this step portion. In the structure of the present invention, however, the control line film is the lowermost layer, and hence, the Nb film, for example, may be up to 2,000 Å-thick in consideration of its penetration depth of the magnetic field. In this case, the thickness may be approximately 1,000 Å depending upon the quality of the Nb film. If the defect of the Nb film is less and the penetration depth into the magnetic field is approximately 500 Å, it can be used as the control line film even when the film thickness is reduced.

There is no particular upper limit to the thickness of the control line film, but the thickness is generally up to about 3,000 to about 4,000 Å because an unnecessarily large thickness only invites an increase in the cost of production. As described already, the control line film and the base electrode layer have the same level and generally use the same superconducting material. Therefore, their thickness is practically the same. An insulating film exists between the superconducting films.

Conventional techniques may be used for the other points of the superconducting switching device of the present invention. The other necessary structures such as the structures of the wiring layer, magnetic shielding layer and the like include those which are well known in the art but are not particularly described.

EXAMPLE 1

This example relates to a two junction quantum interferometer based upon the present invention.

Figure 4:
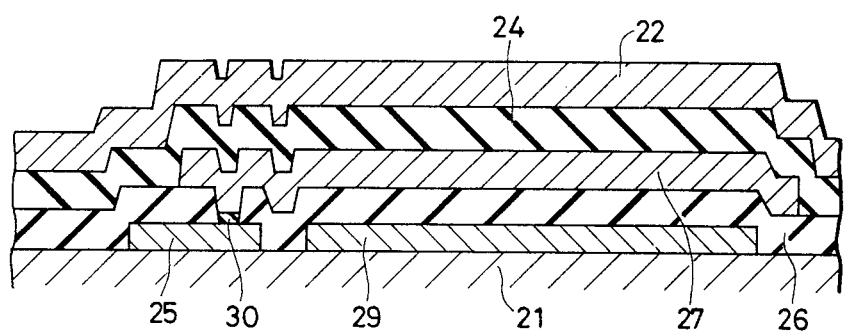
FIG. 4 is a sectional view of the two junction quantum interferometer in accordance with one embodiment of the present invention.

In this example, a single crystal silicon plate 21 having its (100) plane parallel to the film surface was used. The two junction quantum interferometer to be produced is shown in FIG. 3. Its transverse section is shown in FIG. 4. The single crystal silicon substrate 21 was prepared by being lightly etched by an $HF+6NH_4F$ solution to remove surface oxides. This silicon substrate 21 was inserted into a d.c. magnetron sputter apparatus to form an Nb film over the entire surface of the substrate. The conditions for forming the Nb film were as follows:
film lamination speed: 20 Å/sec
Ar pressure: $4 \times 10^{-3}$ Torr
Nb film thickness: 1,500 Å
The critical temperature of another Nb film produced under the same condition was 9° K.

A resist pattern to be used for forming the base electrode film and control line film of the quantum interferometer was formed on the silicon wafer having formed the Nb film on its entire surface. The sample was fitted to an ion etching apparatus and the Nb film was patterned by etching using an Ar ion beam, thereby forming the base electrode film 25 and control line film 29 of the superconducting tunnel junction. Next, a lift-off pattern was formed using a resist so as to form an inter-layer insulating film 26 (lower insulating film). Next, a 2,000 Å-thick SiO film was formed in a vacuum deposition apparatus. The SiO film could be easily vacuum deposited by resistance heating using a chimney type crucible. At this time, the opening for the superconducting tunnel junction was formed simultaneously.

Next, a lift-off pattern for a counter electrode 27 of the tunnel junction was formed using a resist. The Si substrate was cooled by water and was fitted to an electrode to which a radio frequency wave could be applied. The Si wafer on which the patterns were formed was exposed to the R.F. plasma of Ar to etch and clean the surface of the Nb film. In this case, the etched depth was from 100 to 200 Å. After the pure Nb film surface was exposed in this manner, pure oxygen was introduced into a vacuum device to form a surface oxide layer of the Nb film as a tunnel junction barrier layer 30.

In the vacuum deposition apparatus, the film of a Pb-In alloy containing 10 wt % of In was formed in a thickness of 3,000 Å by sequential vacuum deposition to form the counter electrode 27. The Si substrate was dipped into acetone and lift-off was effected, forming the pattern of the Pb-In alloy. Furthermore, an inter-layer insulating film (upper insulating film layer) 24 of SiO was formed in such a manner as to cover the entire surface of the quantum interferometer and a Pb-In superconducting film 22 for magnetic shielding was formed on the former.

Incidentally, before forming the SiO film covering the entire surface, the surfaces of the Nb and Pb-In films exposed to the surface were oxidized to make complete electric insulation between the superconducting film and magnetic shielding film that constituted the quantum interferometer.

Whenever necessary, an SiO film which was about 1 μm thick and which had the same pattern as that of the magnetic shielding layer 22 was deposited on the latter, as a protective film. The thickness of the protective layer is generally such that it can sufficiently cover the magnetic shielding layer without causing a defect at the step portions of the electrode layers and the like. Incidentally, the protective film is omitted in FIG. 4.

The threshold curve of the quantum interferometer thus produced was the same as that of the conventional quantum interferometer, and the interferometer was confirmed as being effective as a switching element of a digital circuit.

EXAMPLE 2

This example relates to a three junction quantum interferometer on the basis of the present invention.

Figure 5:
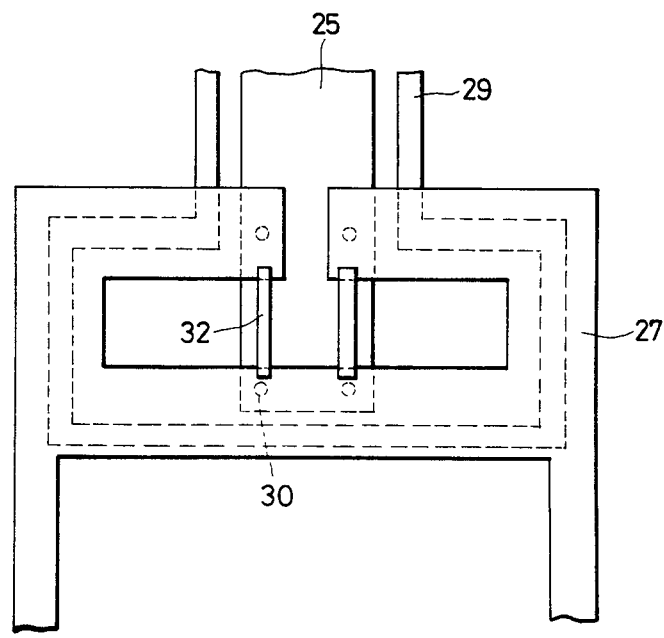
FIG. 5 is a top view of a three junction quantum interferometer in accordance with another embodiment of the present invention.

FIG. 5 illustrates an example of the three junction quantum interferometer produced in this example. The planar structure of this three junction quantum interferometer is substantially the same as that of aforementioned Gheewala et al, arrangement but the disposition in the vertical direction to the substrate surface and structure are entirely different. A square base electrode 25 of the tunnel junction and a control line film 29 were formed immediately on the substrate. Next, a counter electrode film 27 having a shape such as shown in the drawing was formed via an inter-layer insulating film having an opening for the junction. The control line film 29 was disposed in such a manner that it did not come into contact with the base electrode 25 of the tunnel junction and did not deteriorate the mutual inductance with the quantum interferometer. A damping resistor 32 for reducing resonance of the quantum interferometer was formed on the tunnel junction at the upper part of the counter electrode film 27. An inter-layer insulating film and a magnetic shielding superconducting film were disposed on the resistor in the same way as in Example 1.

Next, the method of producing this three junction quantum interferometer will be described. The treatment of the substrate surface and the formation of the base electrode film 25 and the control line film 29, the tunnel junction barrier layer 30, the inter-layer insulating film and the counter electrode film 27 were carried out in the same way as in Example 1. The damping resistance 32 was formed in a thickness of 1,000 Å by resistive heating in vacuo using an AuIn$_2$ film, and the pattern formation was effected by lift-off. Furthermore, a 4,000 Å-thick SiO inter-layer insulating film was formed so as to cover the entire surface of the quantum interferometer, and a 5,000 Å-thick Pb-In superconducting film was formed thereon for magnetic shielding.

The threshold curve of the three junction quantum interferometer thus produced was substantially the same as that of the conventional three junction quantum interferometer, and no disadvantage was observed in the gain characteristics. Accordingly, it became clear that this quantum interferometer was effective as a switching element of a digital circuit.

Hereinafter, the effects of the present invention will be described.

As described already, the present invention does not dispose the control line as a layer having an independent level. Therefore, the number of patterning masks and films can be reduced by two layers, including one inter-layer insulating film, in comparison with the conventional method. In the Gheewala's structure, the step of forming a superconducting film to establish connection between the magnetic shielding film and the switching element and the wiring is necessary. The present invention does not need such a specific layer. All the principal wirings can be made by use of Nb or Nb type film of the first layer which is common to the base electrode film below the Josephson junction and the control line film. Connection between the wirings can be attained by use of a superconducting layer common to the counter electrode of the Josephson junction. Where the dimension of the resistance film has to be determined by the insulating film, the inter-layer insulating film between the counter and base electrode films can be used for this purpose. In the conventional structure, the resistance film is formed below the base electrode film. To determine the length of the resistance film, an inter-layer insulating film having a predetermined length must be formed on the resistance film. In the present invention, on the other hand, the resistance film is formed after the formation of the base electrode film of the tunnel junction so that the inter-layer insulating film between the counter and base electrode films can be used in common as the inter-layer insulating film for determining the dimension of the resistance film. In this point, too, the numbers of the mask and film can be reduced by one.

In conjunction with the number of masks, the protective film can also be omitted. If the pattern which is selected as one in which no lead wire is directly extended from the magnetic shielding superconducting film, the protective insulating film can be formed using the same resist pattern after the magnetic shielding film is formed by use of that resist pattern.

In accordance with the structure of the present invention, further, after the counter electrode film of the Josephson junction is formed, the surface of the superconducting film exposed to the surface is oxidized by R.F. discharge in an oxygen atmosphere, and an inter-layer insulating film to maintain the electric insulation with the magnetic shielding film is formed on it. Hence, electric insulation between the magnetic shielding layer and the lower superconducting film is complete. Moreover, the mask pattern for the anodic oxidation of the magnetic shielding film and the anodic oxidation step can be omitted.

In summary, in accordance with the switching device structure of the present invention, a maximum reduction of six mask layers and five film layers can be achieved in comparison with the conventional method. In other words, the film layers that can be reduced are the control line film and its accompanying inter-layer insulating film, the inter-layer insulating film for determining the dimension of the resistance film, the superconducting film to establish connection with the magnetic shielding film and the anodic oxidation film. Accordingly, the device structure can be completed by at least seven mask layers and seven or eight film layers. That is to say, the necessary film layers are the film for the base electrode and control line, the resistance film, two interlayer insulating films, the counter electrode film, the magnetic shielding film, the protective film and a pad (which is omitted in the drawing). Since the base electrode and control line film, which contains the most complicated and delicate pattern, is formed on the flat substrate surface, it is obviously possible to minituarize the pattern and to improve its accuracy and reliability. It is not particularly difficult to etch and shape with high fidelity a 1 μm-wide Nb wiring film or control line film. The formation of the delicate pattern can be further facilitated by the fact that the thickness of the Nb wiring film can be reduced down to a value ($\approx$1,200 to 1,300 Å) which is limited by the penetration depth (700 to 800 Å) of the magnetic field.

The intensity of the magnetic field penetrating into a superconductor is proportional to $\exp(-x/\lambda)$, where $x$ is the distance in the direction of thickness from the surface of the superconductor and $\lambda$ is the magnetic field penetration depth. It is therefore sufficient if the Nb film has a thickness which is approximately twice the magnetic field penetration depth.

Formation of the Nb type film on the single crystal substrate provides the following two effects. For example, the bonding power of the Nb film formed by sputtering on the single crystal Si substrate is higher than that of the Si thermal oxidation film or that of the Nb film formed on the SiO film. This is important in order to improve the reliability of the device produced. A point of further importance relates to uniformity of the Josephson critical current values of the superconducting tunnel junction. The surface oxide layer of the base electrode film is generally used as the tunnel junction barrier layer. The thickness of this surface oxidation layer depends upon the crystal direction, as is well known in the art. For instance, the initial oxidation rate is higher on the (111) plane of Si than on its (100) plane. Accordingly, if the base electrode formed on the polycrystalline substrate has the crystal orientation thereof facing in arbitrary directions, as in the conventional method, the local change of the thickness of the oxide film is inevitable. This provides non-uniformity of the Josephson critical current. The base electrode of the present invention, which is formed on the single crystal substrate and has well aligned crystal orientation, is oxidized in a uniform thickness and provides a superconducting tunnel junction line having a uniform Josephson critical current.

Having described a specific embodiment of the present invention, it is believed obvious that various modifications and variations of the invention are possible in light of the above teachings. It is therefore to be understood that within the scope of the appended claims, the invention may be practised otherwise than as specifically described.

What is claimed is:

1. A superconducting switching device characterized in that a control line film is disposed at the same level as that of a base electrode layer of a sandwich type superconducting tunnel junction.

2. The superconducting switching device as defined in claim 1 wherein said control line film and said base electrode layer are directly deposited to the surface of a substrate.

3. The superconducting switching device as defined in claim 2 wherein the surface of said substrate consists of a single crystal.

4. The superconducting switching device as defined in claim 3 wherein said base electrode layer and said control line film consist of Nb or an Nb-containing superconducting material.

5. A superconducting switching device characterized in that a lower insulating film layer having an opening is disposed at a predetermined position on one main surface of a substrate equipped with a base electrode layer of a sandwich type superconducting tunnel junction and with a control line film disposed at the same level as that of said base electrode layer, a counter electrode layer is disposed on said insulating film in such a manner as to connect with said base electrode layer at said opening via a tunnel junction barrier layer, and a magnetic shielding layer is disposed on said counter electrode layer and said lower insulating film layer via an upper insulating film layer.

6. The superconducting switching device as defined in claim 5 wherein the surface of said substrate consists of a single crystal.

7. The superconducting switching device as defined in claim 5 wherein said base electrode layer and said control line film consist of Nb or an Nb-containing superconducting material.

* * * * *